(12) United States Patent
Wang

(10) Patent No.: US 12,527,211 B2
(45) Date of Patent: Jan. 13, 2026

(54) DISPLAY APPARATUS AND MANUFACTURING METHOD THEREFOR

(71) Applicant: BOE Technology Group Co., Ltd., Beijing (CN)

(72) Inventor: Hejin Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 557 days.

(21) Appl. No.: 17/921,578

(22) PCT Filed: Jun. 8, 2021

(86) PCT No.: PCT/CN2021/098798
§ 371 (c)(1),
(2) Date: Oct. 26, 2022

(87) PCT Pub. No.: WO2022/017020
PCT Pub. Date: Jan. 27, 2022

(65) Prior Publication Data
US 2023/0165119 A1 May 25, 2023

(30) Foreign Application Priority Data
Jul. 24, 2020 (CN) .......................... 202010721854.4

(51) Int. Cl.
*H10K 59/80* (2023.01)
*H10K 59/12* (2023.01)
(Continued)

(52) U.S. Cl.
CPC ..... *H10K 59/8791* (2023.02); *H10K 59/1201* (2023.02); *H10K 59/131* (2023.02); *H10K 59/40* (2023.02); *H10K 59/873* (2023.02)

(58) Field of Classification Search
None
See application file for complete search history.

(56) References Cited

U.S. PATENT DOCUMENTS

| 2013/0328798 A1 | 12/2013 | Chen |
| 2014/0117330 A1 | 5/2014 | Cho et al. |
| 2016/0104869 A1* | 4/2016 | Choi .................. H10K 59/8792 257/40 |

FOREIGN PATENT DOCUMENTS

| CN | 103744572 A | 4/2014 |
| CN | 103794734 A | 5/2014 |

(Continued)

OTHER PUBLICATIONS

PCT/CN2021/098798 international search report.

*Primary Examiner* — Kyoung Lee
(74) *Attorney, Agent, or Firm* — IPro, PLLC

(57) ABSTRACT

A display apparatus and a manufacturing method therefor. The display apparatus comprises: a substrate; a display device, which is located on the substrate; a touch-control electrode layer, which is located on the side of the display device that faces away from the substrate; and an anti-reflection structure, which is located between the display device and the touch-control electrode layer, wherein the anti-reflection structure comprises transparent dielectric layers and a metal layer, which are arranged in an alternating and stacked manner, the metal layer being located between the transparent dielectric layers, there being at least two transparent dielectric layers, and there being at least one metal layer.

13 Claims, 6 Drawing Sheets

(51) Int. Cl.
*H10K 59/131* (2023.01)
*H10K 59/40* (2023.01)

(56) References Cited

FOREIGN PATENT DOCUMENTS

| | | |
|---|---|---|
| CN | 105514296 A | 4/2016 |
| CN | 106095208 A | 11/2016 |
| CN | 110045874 A | 7/2019 |
| CN | 110968218 A | 4/2020 |
| CN | 111722757 A | 9/2020 |

* cited by examiner

DISPLAY APPARATUS AND MANUFACTURING METHOD THEREFOR

CROSS REFERENCE TO RELATED APPLICATIONS

The present application is a National Stage of International Application No. PCT/CN2021/098798, filed on Jun. 8, 2021, which claims the priority of the Chinese patent application No. 202010721854.4 filed to China National Intellectual Property Administration on Jul. 24, 2020 of which the entire contents are incorporated herein by reference.

FIELD

The present disclosure relates to the technical field of display, in particular to a display apparatus and a manufacturing method therefor.

BACKGROUND

Active-matrix organic light emitting diode (AMOLED) is called the next generation of display technology. A structure of an AMOLED screen of a mobile electronic device mainly includes an AMOLED panel, a touch control panel, a circular polarizer and a protective cover plate. In a structure of the existing AMOLED display panel, in order to improve light extraction efficiency, a metal material with high reflectivity is usually used as an anode, and a semi-transparent metal cathode is used to form a micro cavity. The most common anode and cathode materials are silver. The reflectivity of silver in a visible light band is 90% or above, which is very prone to reflect external ambient light, leading to decrease of visibility of the display panel.

The cathode of the existing AMOLED display panel is a whole surface. In order to reduce or eliminate the influence of the external ambient light on the visibility of the display panel and increase contrast, the circular polarizer needs to be added in the structure of the display panel to offset the external ambient light. However, the polarizer is relatively thick, and the current development trend of an AMOLED display technology is flexible folding. The use of the thick polarizer is prone to influence the repeated folding ability of a flexible screen.

SUMMARY

A display apparatus provided by an embodiment of the present disclosure includes: a substrate; a display device on the substrate; a touch-control electrode layer on one side of the display device away from the substrate; and an anti-reflection structure between the display device and the touch-control electrode layer, wherein the anti-reflection structure includes at least two transparent dielectric layers and at least one metal layer which are arranged in an alternating and stacked manner, and the metal layer is between the transparent dielectric layers.

Optionally, in the above display apparatus provided by the embodiment of the present disclosure, the anti-reflection structure includes a first transparent dielectric layer, a first metal layer, a second transparent dielectric layer, a second metal layer, and a third transparent dielectric layer which are arranged in the alternating and stacked manner.

Optionally, the above display apparatus provided by the embodiment of the present disclosure further includes an encapsulation layer between the display device and the touch-control electrode layer, and the anti-reflection structure is between the display device and the encapsulation layer.

Optionally, in the above display apparatus provided by the embodiment of the present disclosure, a material of the transparent dielectric layers is a transparent conductive material.

Optionally, the above display apparatus provided by the embodiment of the present disclosure further includes an encapsulation layer between the display device and the touch-control electrode layer, and the anti-reflection structure is between the encapsulation layer and the touch-control electrode layer.

Optionally, in the above display apparatus provided by the embodiment of the present disclosure, an orthographic projection of the metal layer on the substrate does not overlap an orthographic projection of a touch-control electrode of the touch-control electrode layer on the substrate.

Optionally, in the above display apparatus provided by the embodiment of the present disclosure, the anti-reflection structure is on a surface of the touch-control electrode layer facing the display device.

Optionally, in the above display apparatus provided by the embodiment of the present disclosure, the anti-reflection structure is on a surface of the encapsulation layer facing the touch-control electrode layer.

Optionally, the above display apparatus provided by the embodiment of the present disclosure further includes a wiring layer between the encapsulation layer and the anti-reflection structure, wherein the wiring layer includes wiring electrically connected with the metal layer on one side close to the substrate, and the wiring is coupled with a fixed voltage.

Optionally, the above display apparatus provided by the embodiment of the present disclosure has a display region and a peripheral region surrounding the display region, the peripheral region has a binding region, the binding region has a binding terminal binding a fixed voltage line, and the wiring is around the peripheral region and is electrically connected with the binding terminal.

Optionally, the above display apparatus provided by the embodiment of the present disclosure further includes an anti-reflection layer on one side of the touch-control electrode layer away from the substrate, and an orthographic projection of the anti-reflection layer on the substrate at least covers an orthographic projection of a touch-control electrode of the touch-control electrode layer on the substrate.

Optionally, in the above display apparatus provided by the embodiment of the present disclosure, a material of the anti-reflection layer is MoTaOx or a black matrix material.

Optionally, in the above display apparatus provided by the embodiment of the present disclosure, the touch-control electrode includes a drive electrode and an induction electrode which are arranged in an insulating and cross manner, the display device includes a plurality of sub-pixels with different light-emitting colors, and orthographic projections of the drive electrode and the induction electrode on the substrate have overlapping regions with each of the sub-pixels.

Optionally, the above display apparatus provided by the embodiment of the present disclosure further includes a cover plate on one side of the anti-reflection layer away from the substrate.

Optionally, in the above display apparatus provided by the embodiment of the present disclosure, a material of the transparent dielectric layers is an inorganic material or an organic material, a thickness of the transparent dielectric layer of the inorganic material is in a range of 50 angstroms to 10000 angstroms, and a thickness of the transparent dielectric layer of the organic material is in a range of 50 angstroms to 50000 angstroms.

Optionally, in the above display apparatus provided by the embodiment of the present disclosure, a material of the metal layer includes one or a combination of Ti, Mo, Cu, Al or Ag, and a thickness of the metal layer is in a range of 10 angstroms to 1000 angstroms.

Accordingly, an embodiment of the present disclosure further provides a manufacturing method for a display apparatus, including: forming a display device on a substrate; forming an anti-reflection structure on one side of the display device away from the substrate, wherein the anti-reflection structure includes at least two transparent dielectric layers and at least one metal layer which are arranged in an alternating and stacked manner, and the metal layer is between the transparent dielectric layers; and forming a touch-control electrode layer on one side of the anti-reflection structure away from the substrate.

Optionally, in the above manufacturing method provided by the embodiment of the present disclosure, forming the display apparatus specifically includes: forming a display device on a substrate; and forming an encapsulation layer, a wiring layer, an anti-reflection structure, a touch-control electrode layer, an anti-reflection layer and a cover plate sequentially on one side of the display device away from the substrate.

Optionally, in the above manufacturing method provided by the embodiment of the present disclosure, forming the display apparatus specifically includes: forming a display device and an encapsulation layer on a substrate sequentially; forming an anti-reflection layer, a touch-control electrode layer and an anti-reflection structure which are stacked on a cover plate sequentially; and aligning and fitting the substrate with the encapsulation layer formed and the cover plate with the anti-reflection structure formed.

DETAILED DESCRIPTION OF THE EMBODIMENTS

Figure 1:
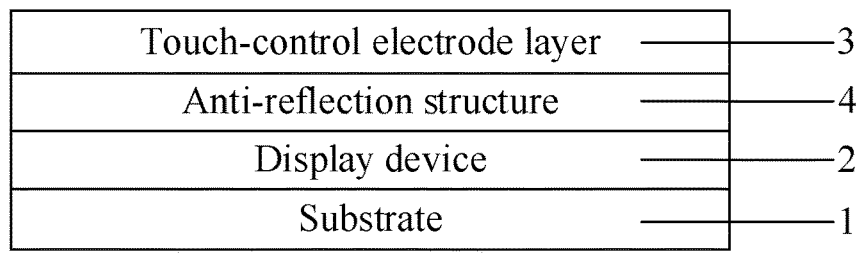
FIG. 1 is a schematic structural diagram of a display apparatus provided by an embodiment of the present disclosure.

In order to make the objective, technical solutions and advantages of the embodiments of the present disclosure clearer, the technical solutions of the embodiments of the present disclosure will be described clearly and completely with reference to drawings of the embodiments of the present disclosure. Obviously, the described embodiments are part of the embodiments of the present disclosure, but not all the embodiments. The embodiments in the present disclosure and features in the embodiments may be mutually combined in the case of no conflict. On the basis of the described embodiments of the present disclosure, all other embodiments obtained by those ordinarily skilled in the art without inventive efforts fall within the protection scope of the present disclosure.

Unless otherwise defined, the technical or scientific terms used in the present disclosure shall have the usual meanings understood by a person of ordinary skill in the art to which the present disclosure belongs. The word "including" or "containing" and the like used in the present disclosure means that an element or item preceding the word covers an element or item listed after the word and the equivalent thereof, without excluding other elements or items. The word "connection" or "coupling" and the like is not restricted to physical or mechanical connection, but may include electrical connection, whether direct or indirect. The words "inner", "outer", "up", "down" and the like are only configured to indicate the relative positional relationship. When the absolute position of the described object changes, the relative positional relationship may also change accordingly.

It should be noted that sizes and shapes of all graphs in the drawings do not reflect the true scale, and only intend to illustrate the content of the present disclosure. The same or similar reference numbers represent the same or similar elements or elements with the same or similar functions from beginning to end.

Figure 2:
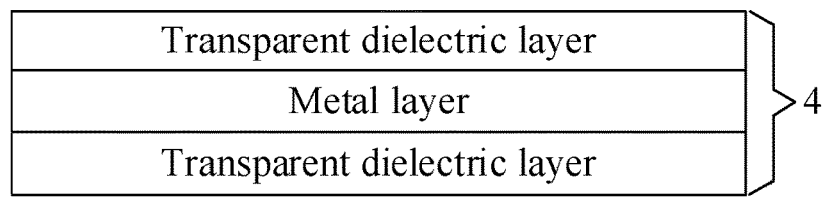
FIG. 2 is a schematic structural diagram of an anti-reflection structure provided by an embodiment of the present disclosure.

An embodiment of the present disclosure provides a display apparatus, as shown in FIG. 1, including: a substrate 1, a display device 2 on the substrate 1, a touch-control electrode layer 3 on one side of the display device 2 away from the substrate 1, and an anti-reflection structure 4 between the display device 2 and the touch-control electrode layer 3. As shown in FIG. 2, the anti-reflection structure 4 includes transparent dielectric layers and a metal layer which are arranged in an alternating and stacked manner, and the metal layer is between the transparent dielectric layers. There are at least two transparent dielectric layers (FIG. 2 takes the example of including the two transparent dielectric layers), and there is at least one metal layer (FIG. 2 takes the example of including one metal layer).

According to the above display apparatus provided by the embodiment of the present disclosure, the anti-reflection structure 4 is arranged between the display device 2 and the touch-control electrode layer 3, thus the anti-reflection structure 4 avoids the use of a circular polarizer, reduces a thickness of the display apparatus, and improves bending resistance of the display apparatus. The transparent dielectric layers and the metal layer which are arranged in the alternating and stacked manner can reduce light generated by reflection of the display apparatus and dissipate ambient light, thus greatly reducing glare generated by the reflection, reducing an intensity of the external ambient light received by a viewer, enhancing anti-reflection performance of the display apparatus, and thus improving visibility of the display apparatus.

It should be noted that the transparent dielectric layers refer to a transparent material with a transmissivity in a range of 50% to 99.9%.

It should be noted that (1) the characteristic of a metal material itself is that its conductivity, reflective ability and absorption ability are strongly related to the thickness; with the increase of the thickness of the metal layer in the anti-reflection structure, the conductivity is high, and it is prone to form a coupling capacitance effect with the touch-control electrode layer; and a way of multi-layer thin metal will be used to increase impedance and reduce influence on touch control; (2) an optical characteristic of the metal material is that the metal material usually shows a reflective characteristic; generally, reflection+transmission+absorption=100%; the thick metal layer will show the characteristics of high reflection, zero transmission and zero absorption; when the metal layer is thinned and a refractive index is adjusted on the surface, the reflectivity can be significantly reduced to be close to 0, mainly showing the transmission and absorption characteristics; and based on experimental results, the metal layer has the lower reflection characteristics after being disassembled into the plurality of layers. In addition, the optical characteristic of the metal material is also significantly related to a film forming quality. Under certain conditions, a single layer of metal layer can also achieve the low reflection characteristic. A structure is a dielectric layer/the metal layer/a dielectric layer, and the dielectric layers are on two sides. Therefore, the two layers of transparent dielectric layer and one layer of metal layer which are arranged in the alternating and stacked manner can realize an anti-reflection function.

Figure 3:
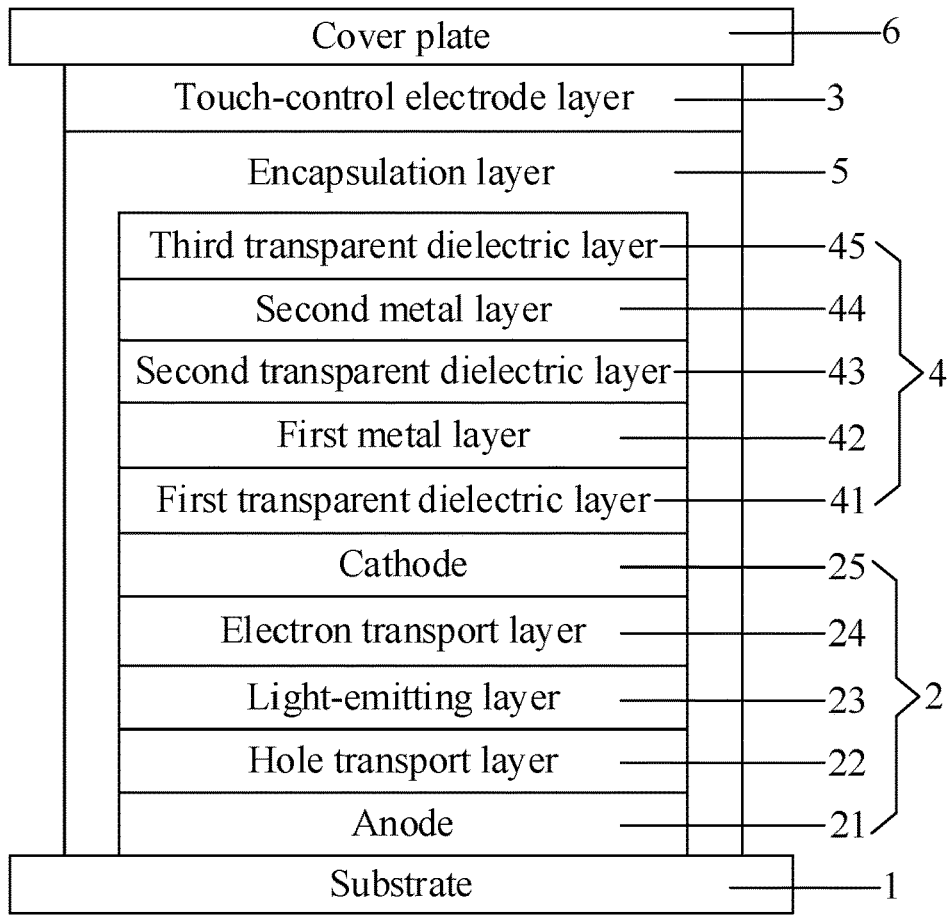
FIG. 3 is a schematic structural diagram of another display apparatus provided by an embodiment of the present disclosure.
Figure 4:
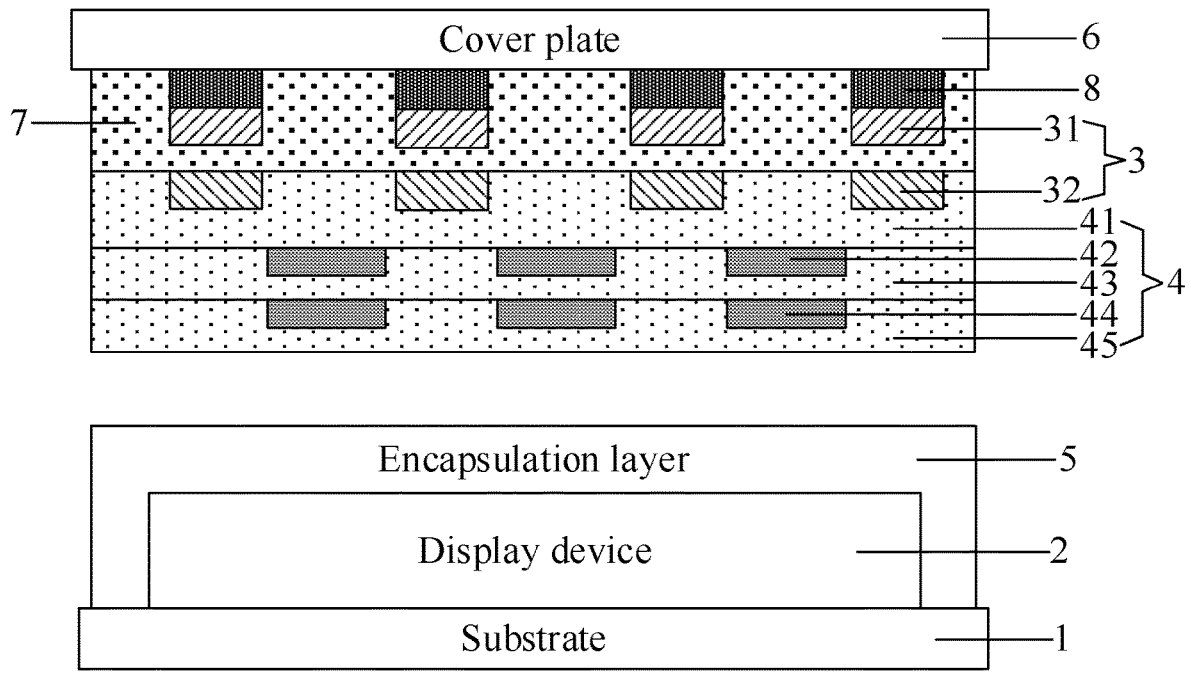
FIG. 4 is a schematic structural diagram of another display apparatus provided by an embodiment of the present disclosure.
Figure 5:
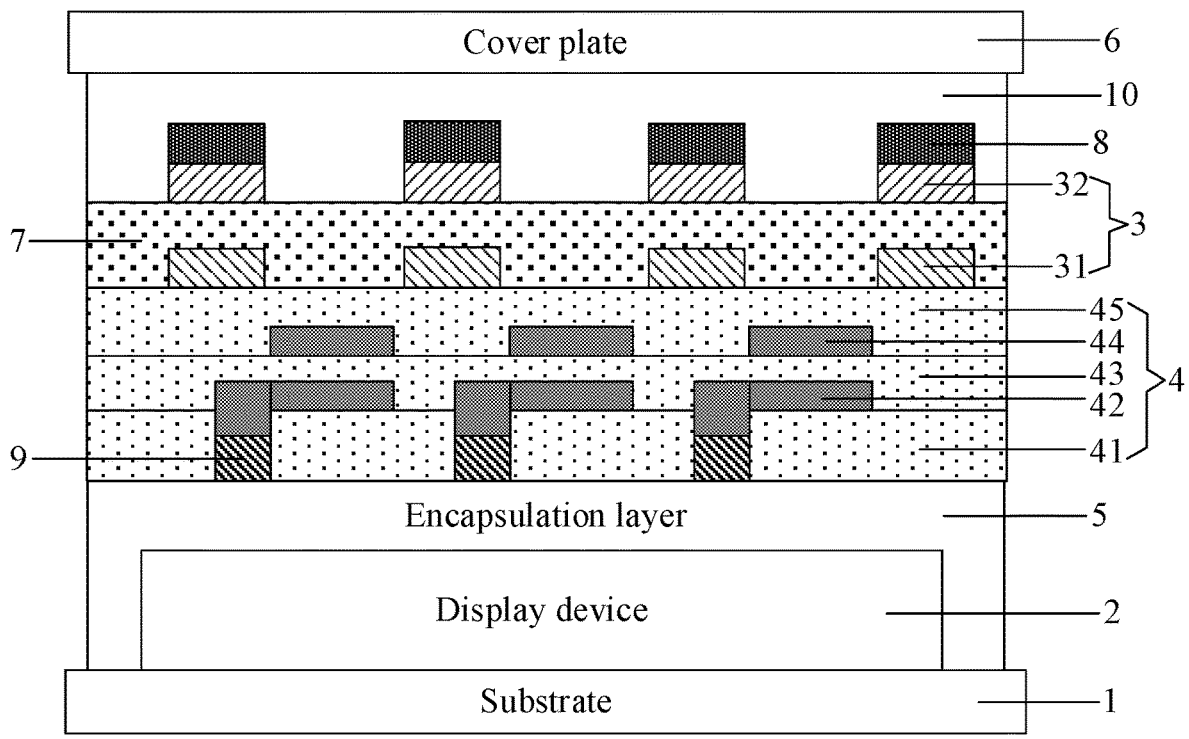
FIG. 5 is a schematic structural diagram of another display apparatus provided by an embodiment of the present disclosure.

During specific implementation, on the basis of ensuring that the light emitted from the display device passes through the anti-reflection structure as much as possible, the ambient light can be scattered to reduce the glare generated by the reflection. In the above display apparatus provided by the embodiment of the present disclosure, as shown in FIG. 3 to FIG. 5, the anti-reflection structure 4 may include a first transparent dielectric layer 41, a first metal layer 42, a second transparent dielectric layer 43, a second metal layer 44, and a third transparent dielectric layer 45 which are arranged in the alternating and stacked manner. Of course, during specific implementation, the anti-reflection structure 4 is not limited to the 3-layer and 5-layer structures, and can be selected according to the actual needs.

The use of the anti-reflection structure instead of the circular polarizer is illustrated in detail below according to a specific position of the anti-reflection structure in the display apparatus.

During specific implementation, in the above display apparatus provided by the embodiment of the present disclosure, as shown in FIG. 3 to FIG. 5, the substrate 1 may include a base and a drive circuit on the base. That is, the substrate 1 is a driving backplane including a thin film transistor structure, and the driving backplane is configured to input a working signal to the display device through a thin film transistor.

During specific implementation, the above display apparatus provided by the embodiment of the present disclosure, as shown in FIG. 3, further includes an encapsulation layer 5 between the display device 2 and the touch-control electrode layer 3, and the anti-reflection structure 4 is between the display device 2 and the encapsulation layer 5. Specifically, according to the present disclosure, the anti-reflection structure 4 is directly manufactured after the display device 2 is manufactured, the anti-reflection structure 4 replaces the use of the circular polarizer, and thus the glare generated by reflecting the ambient light is reduced and the thickness of the display apparatus is reduced, thereby improving the bending resistance of the display apparatus. In addition, if the metal layer in the anti-reflection structure 4 is close to the touch-control electrode layer 3 in distance, a signal of the touch-control electrode layer 3 will be interfered. In FIG. 3 of the embodiment of the present disclosure, the anti-reflection structure 4 is arranged between the display device 2 and the encapsulation layer 5. Since the thickness of the encapsulation layer 5 is generally large, the influence of the metal layer in the anti-reflection structure 4 on the touch-control electrode layer 3 may be isolated through the encapsulation layer 5, so as not to cause interference.

During specific implementation, in the above display apparatus provided by the embodiment of the present disclosure, as shown in FIG. 3, the display device 2 may be an electroluminescent device, specifically including an anode 21, a hole transport layer 22, a light-emitting layer 23, an electron transport layer 24 and a cathode 25 which are stacked on the substrate 1. It should be noted that FIG. 3 of the embodiment of the present disclosure takes an example that the display device 2 is of a normal structure. Of course, the display device 2 may also be of an inverted structure, that is, the display device 2 may include a cathode 25, an electron transport layer 24, a light-emitting layer 23, a hole transport layer 22 and an anode 21 which are stacked on the substrate 1. In order to adjust efficiency of the anode 21 and the cathode 25 injecting carriers into the light-emitting layer 23, the display device may further include other functional film layers, such as a hole injection layer, an electron injection layer, an electron blocking layer and a hole blocking layer, which can be selected and set according to actual needs.

During specific implementation, in the above display apparatus provided by the embodiment of the present disclosure, as shown in FIG. 3, the anode 21 may be of an ITO/Ag/ITO composite structure; the cathode 25 may be of a Mg/Ag composite structure, the material of the transparent dielectric layers (the first transparent dielectric layer 41; and the second transparent dielectric layer 43 and the third transparent dielectric layer 45) may be an inorganic material or an organic material. The inorganic material may be silicon oxide or silicon nitride, and a thickness of the transparent dielectric layer of the inorganic material is in range of 50 angstroms to 10000 angstroms. The organic material may be a small-molecule organic material, and a thickness of the transparent dielectric layer of the small-molecule organic material is in range of 50 angstroms to 10000 angstroms. Generally, the display apparatus is further internally provided with a light extraction layer (e.g., capping layer (CPL)). The material of the transparent dielectric layers may also be the CPL, and the thickness of the transparent dielectric layer may be in range of 50 angstroms to 10000 angstroms. A material of the metal layer (the first metal layer 42 and the second metal layer 44) may include one or a combination of Ti, Mo, Cu, Al or Ag, and a thickness of the metal layer may be in range of 10 angstroms to 1000 angstroms.

Specifically, for example, when the material of the transparent dielectric layers is the CPL, a refractive index of the transparent dielectric layers is 1.4, the thickness of each of the transparent dielectric layers is 800 angstroms, the metal layer is formed by Ti evaporation, and a thickness of each of the metal layers is 40 angstroms, surface reflectivity of the display apparatus shown in FIG. 3 provided by the embodiment of the present disclosure may be reduced from 46% (46% is reflectivity of the display apparatus when the anti-reflection structure is not arranged and is reflectivity of common display products, the present disclosure is only an example, and the reflectivity of the display apparatus is not limited to 46%) to about 5% (reflectivity of the display apparatus when the anti-reflection structure is arranged), and a brightness of the display apparatus is about 35% of that of the display apparatus when the anti-reflection structure is not arranged. In the related art, when the circular polarizer is arranged, the brightness is about 46% of that when the circular polarizer is not arranged, and the reflectivity is 5%. Therefore, the anti-reflection structure arranged in the present disclosure is compared with the circular polarizer arranged in the related art, the reflectivity and the display brightness have little difference, but the thickness of the anti-reflection structure in the present disclosure is much lower than that of the circular polarizer, the thickness of the circular polarizer is generally nearly 100 µm, and the circular polarizer is generally fit with a touch control layer through pressure-sensitive adhesive, while the anti-reflection structure only needs to be arranged to be a few microns. Therefore, the overall thickness of the display apparatus in the present disclosure may be reduced by nearly 100 µm, the thickness of the display apparatus is greatly reduced, and the ability of the display apparatus to bend repeatedly may be improved for flexible display.

During specific implementation, since the cathode is generally arranged on the whole surface, in order to improve the transmissivity, the cathode is manufactured to be very thin, and thus cathode impedance is large, resulting in a large cathode voltage drop, which affects display. In order to solve the problem of the large cathode voltage drop. In the above display apparatus provided by the embodiment of the present disclosure, as shown in FIG. 3, the material of the transparent dielectric layers may be a transparent conductive material, that is, materials of the first transparent dielectric layer 41, the second transparent dielectric layer 43 and the third transparent dielectric layer 45 are all the transparent conductive materials, thus each film layer of the anti-reflection structure 4 is the conductive material, and the anti-reflection structure 4 and the cathode 25 are equivalent to be parallelly arranged, so that the impedance of the cathode 25 can be reduced, so as to reduce the cathode voltage drop and improve the light-emitting efficiency of the display device. Therefore, in the structure shown in FIG. 3 provided by the embodiment of the present disclosure, the alternating and stacking of the metal layer and the transparent dielectric layers can not only reduce the reflection, but also reduce the cathode impedance at the same time.

During specific implementation, when the material of the transparent dielectric layers is the transparent conductive material, the transparent conductive material may be ITO, IZO, etc.

Specifically, for example, when the material of the transparent dielectric layers is IZO, the refractive index of the transparent dielectric layers is 2.0, the thickness of each of the transparent dielectric layers is 800 angstroms, the metal layer (the first metal layer 42 and the second metal layer 44) is formed by Ti evaporation, and a thickness of each of the metal layers is 35 angstroms, the surface reflectivity of the display apparatus shown in FIG. 3 provided by the embodiment of the present disclosure may be reduced from 46% (46% is the reflectivity of the display apparatus when the anti-reflection structure is not arranged and is the reflectivity of common display products, the present disclosure is only an example, and the reflectivity of the display apparatus is not limited to 46%) to about 5% (the reflectivity of the display apparatus when the anti-reflection structure is arranged), and the brightness of the display apparatus is about 40% of that of the display apparatus when the anti-reflection structure is not arranged. In the related art, when the circular polarizer is arranged, the brightness is about 42% of that when the circular polarizer is not arranged, and the reflectivity is 5%. Therefore, the anti-reflection structure arranged in the present disclosure is compared with the circular polarizer arranged in the related art, the reflectivity and the display brightness have little difference, but the thickness of the anti-reflection structure in the present disclosure is much lower than that of the circular polarizer, the thickness of the circular polarizer is generally nearly 100 µm, while the anti-reflection structure only needs to be arranged to be a few microns. Therefore, the thickness of the display apparatus may be greatly reduced, and the ability of the display apparatus to bend repeatedly may be improved for flexible display. In addition, a composite structure of the transparent dielectric layers (IZO) and the cathode (Ti) has a conductive effect, which can effectively reduce the cathode impedance.

During specific implementation, the above display apparatus provided in the embodiment of the present disclosure, as shown in FIG. 3, further includes a cover plate 6 on one side of the touch-control electrode layer 3 away from the substrate 1. The cover plate 6 may be either a glass cover plate or a plastic cover plate. Of course, during specific implementation, the display apparatus shown in FIG. 3 may further include other functional film layers well known to those skilled in the art, which is not described in detail here.

During specific implementation, the above display apparatus provided by the embodiment of the present disclosure, as shown in FIG. 4 and FIG. 5, further includes an encapsulation layer 5 between the display device 2 and the touch-control electrode layer 3, and the anti-reflection structure 4 is between the encapsulation layer 5 and the touch-control electrode layer 3. By arranging the anti-reflection structure 4 between the encapsulation layer 5 and the touch-control electrode layer 3, the bending resistance of the display apparatus can be improved, the light generated by the reflection of the display apparatus can be reduced, and anti-reflection performance of the display apparatus can be enhanced.

Figure 6:
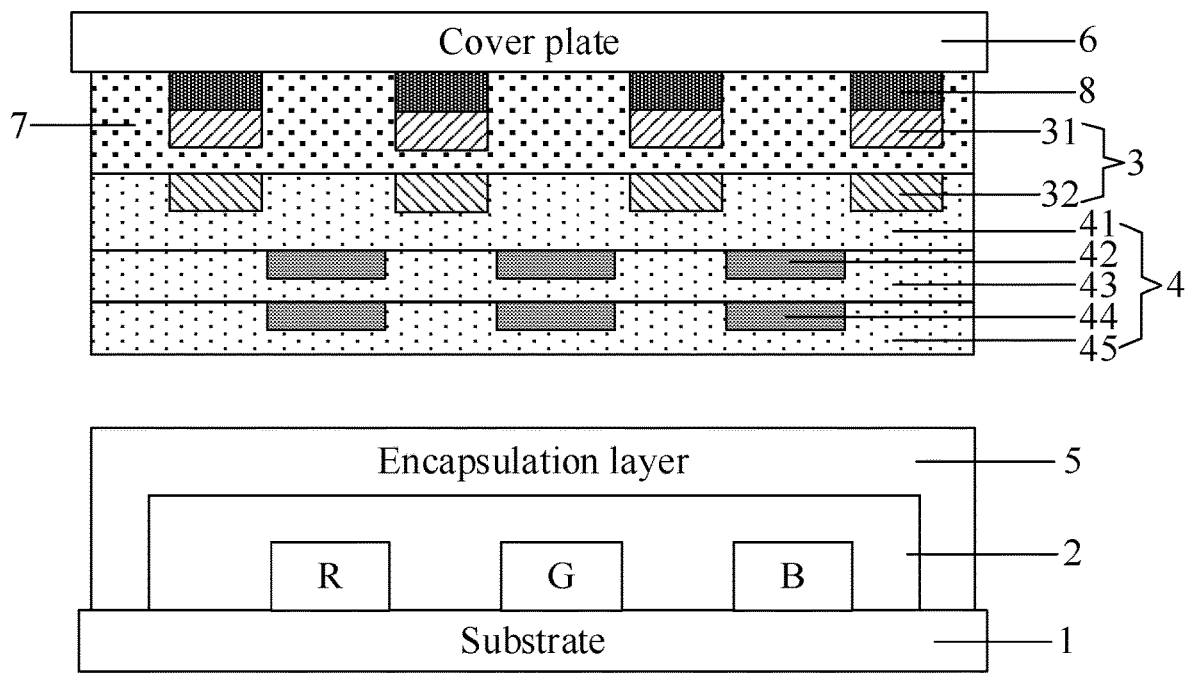
FIG. 6 is a schematic structural diagram of another display apparatus provided by an embodiment of the present disclosure.
Figure 7:
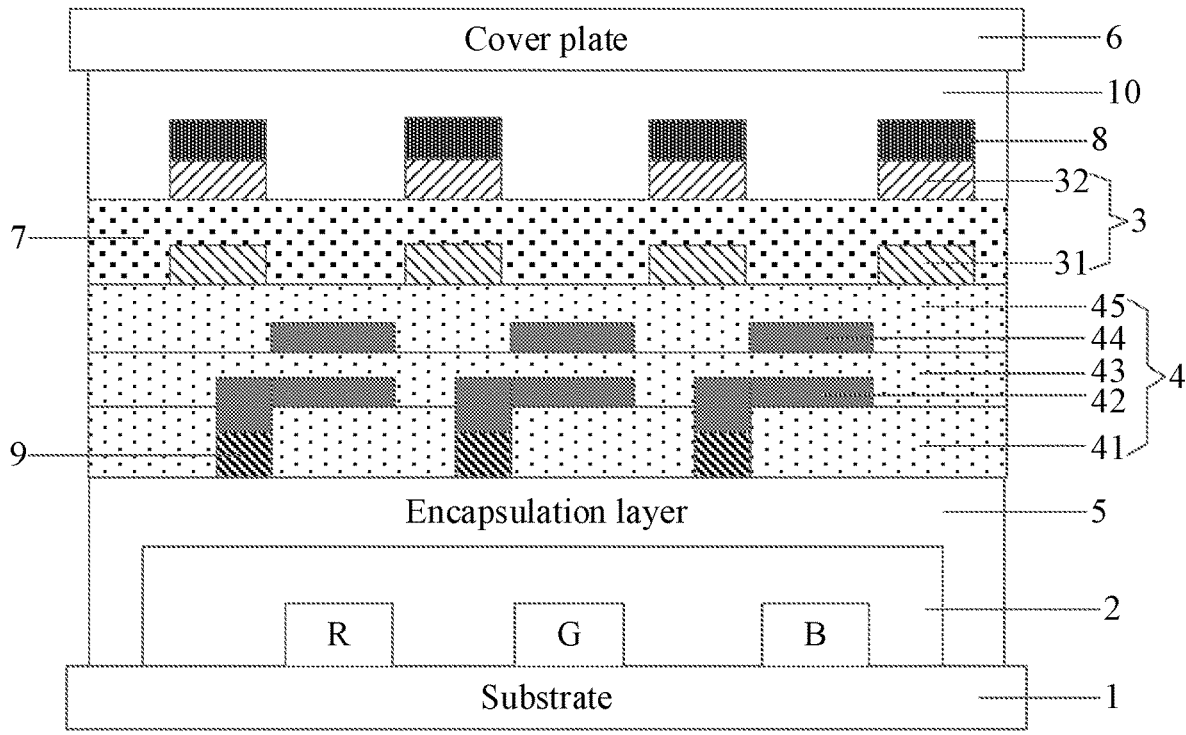
FIG. 7 is a schematic structural diagram of another display apparatus provided by an embodiment of the present disclosure.

During specific implementation, in the above display apparatus provided by the embodiment of the present disclosure, as shown in FIG. 6 and FIG. 7, FIG. 6 is a structure corresponding to FIG. 4, and FIG. 7 is a structure corresponding to FIG. 5. The display device 2 generally includes sub-pixels of different light-emitting colors, such as a red sub-pixel R, a green sub-pixel G, and a blue sub-pixel B. Of course, the display device may also include sub-pixels of other colors, such as a white sub-pixel and a yellow sub-pixel.

Figure 8:
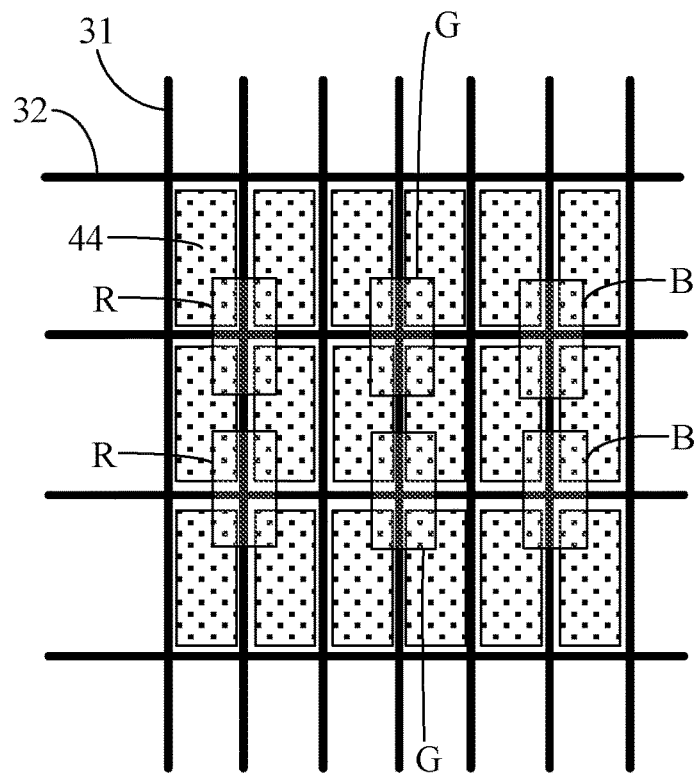
FIG. 8 is a schematic top view of a display apparatus provided by an embodiment of the present disclosure.

During specific implementation, in the above display apparatus provided by the embodiment of the present disclosure, as shown in FIG. 4 and FIG. 5, the touch-control electrode layer 3 includes a drive electrode 31 and an induction electrode 32 which are arranged in an insulating and cross manner, and the drive electrode 31 and the induction electrode 32 are arranged in the insulating manner through an insulating layer 7. The common patterns of the touch-control electrode layer 3 include three types, The first type is to use grid wiring in a gap between pixels, which does not block the pixels completely. This preparation method requires accurate aligning preparation, and can only be realized during direct and continuous integration preparation on encapsulation. The second type is that the touch-control electrode layer is transparent. This kind of touch control usually uses transparent electrode materials such as large area ITO, which is prone to interfere with an electrode of an OLED, does not need to be aligned, and is usually integrated by external pasting. The third type is the use of metal grids. Thin metal wiring (in a range of about 1 μm to 5 μm, usually 1.5 μm to 3 μm) forms a specific spacing, and is usually integrated by plug-in touch control. Because the metal wiring are thin, there will be a small number of pixels being blocked, but the blocking area is small, which can be ignored. On the whole, the touch control layer may be considered transparent, and the advantage of the third type is that it does not require alignment, and can be directly fit. In consideration of transparency and alignment, the touch-control electrode layer 3 of the embodiment of the present disclosure selects the solution of the third type of touch-control electrode layer, the top view of which is shown in FIG. 8. The metal layers (the first metal layer 42 and the second metal layer 44) are between gaps of the touch-control electrode layer 3, but has no one-to-one correspondence with patterns of the sub-pixels (R, G and B) in size and position. The metal layers and the sub-pixels may be in one-to-one correspondence, or may be many-to-one. FIG. 8 is illustrated by taking an example that one sub-pixel corresponds to the plurality of metal layers.

Specifically, since the touch-control electrode layer adopts a metal grid structure, the touch-control layer is transparent as a whole, so as shown in FIG. 8, orthographic projections of the drive electrode 31 and the induction electrode 32 on the substrate 1 may have overlapping regions with each sub-pixel (R, G and B), and thus the method of fitting the touch-control electrode layer is simple without the need for alignment.

During specific implementation, since the anti-reflection structure is directly arranged between the encapsulation layer and the touch-control electrode layer, in order to prevent the formation of coupling capacitance between the metal layer in the anti-reflection structure and the touch-control electrode layer from affecting the touch control performance, in the above display apparatus provided by the embodiment of the present disclosure, as shown in FIG. 4 and FIG. 5, an orthographic projection of the metal layers (the first metal layer 42 and the second metal layer 44) on the substrate 1 does not overlap an orthographic projection of touch-control electrodes (the drive electrode 31 and the induction electrode 32) of the touch-control electrode layer 3 on the substrate 1. That is, in order to avoid the formation of the coupling capacitance between the metal layer in the anti-reflection structure 4 and the touch-control electrode layer 3 from affecting the touch control, pattern processing is made on the metal layer in the present disclosure, thereby reducing a load of capacitive touch control. In this way, when the touch-control electrode layer 3 adopts a metal grid structure, the first metal layer 42 and the second metal layer 44 may be arranged to be that the orthographic projections are in mesh of the grid structure, so as not to affect the touch control performance.

During specific implementation, in order to reduce the reflectivity of the touch-control electrode layer, the above display apparatus provided by the embodiment of the present disclosure, as shown in FIG. 4-FIG. 7, further includes an anti-reflection layer 8 on one side of the touch-control electrode layer 3 away from the substrate 1, and an orthographic projection of the anti-reflection layer 8 on the substrate 1 at least covers an orthographic projection of the touch-control electrodes (the drive electrode 31 and the induction electrode 32) of the touch-control electrode layer 3 on the substrate 1.

During specific implementation, the above display apparatus provided in the embodiment of the present disclosure, as shown in FIG. 4-FIG. 7, further includes a cover plate 6 on one side of the anti-reflection layer 8 away from the substrate 1. The cover plate 6 may be either a glass cover plate or a plastic cover plate. Of course, during specific implementation, the display apparatus shown in FIG. 4 and FIG. 5 may further include other functional film layers well known to those skilled in the art, which is not described in detail here.

Specifically, as shown in FIG. 4-FIG. 7, the touch-control electrode of the touch-control electrode layer 3 has the metal grid structure, and a material of the anti-reflection layer 8 may be MoTaOx or a Black Matrix material. As shown in FIG. 4 and FIG. 6, since the anti-reflection layer 8 is manufactured on the cover plate 6, the material of the anti-reflection layer 8 is preferably MoTaOx, and a pattern of the anti-reflection layer 8 is the same as that of the touch-control electrode layer 3. As shown in FIG. 5 and FIG. 7, since the anti-reflection layer 8 is manufactured on the display device 2, the material of the anti-reflection layer 8 may be selected from MoTaOx or the black matrix material. When MoTaOx is selected, the pattern of the anti-reflection layer 8 is the same as that of the touch-control electrode layer 3. When the black matrix material is selected, since an orthographic projection of the anti-reflection layer 8 is in a non-light-emitting region (gaps among R, G and B), a width of the non-light-emitting region is generally about in a range of 18 μm to 20 μm, while a width of the touch-control electrode wiring is generally in a range of 3 μm to 5 μm. Therefore, in order to reduce the reflection as much as possible, the black matrix material may be manufactured to cover the non-light-emitting region as much as possible, that is, the orthographic projection of the anti-reflection layer 8 on the substrate 1 is greater than the orthographic projection of the touch-control electrode on the substrate 1.

During specific implementation, in the above display apparatus provided by the embodiment of the present disclosure, as shown in FIG. 4, the anti-reflection structure 4 is arranged on a surface of the touch-control electrode layer 3 facing the display device 2. In this way, first the anti-reflection layer 8, the drive electrode 31, the insulating layer 7, the induction electrode 32 and the anti-reflection structure 4 may be formed on the cover plate 6 sequentially, then the display device 2 and the encapsulation layer 5 are formed on the substrate 1 sequentially, and finally the cover plate 6 with the anti-reflection structure 4 formed and the substrate 1 with the encapsulation layer 5 formed are aligned and fitted to form the display apparatus shown in FIG. 4 provided by the embodiment of the present disclosure.

It should be noted that a certain gap is left between the anti-reflection structure 4 and the encapsulation layer 5 in FIG. 4 to illustrate that the display apparatus shown in FIG.

5 is formed by alignment and fitting. In an actual product, the anti-reflection structure 4 and the encapsulation layer 5 are fitted by an adhesive layer.

During specific implementation, in the above display apparatus provided by the embodiment of the present disclosure, as shown in FIG. 5, the anti-reflection structure 4 is arranged on a surface of the encapsulation layer 5 facing the touch-control electrode layer 3. In this way, the display device 2, the encapsulation layer 5, the anti-reflection structure 4, the induction electrode 32, the insulating layer 7, the drive electrode 31, the anti-reflection layer 8, and the cover plate 6 may be formed on the substrate 1 sequentially, that is, the display apparatus shown in FIG. 5 provided by the embodiment of the present disclosure is formed.

During specific implementation, in order to avoid the interference of the cathode signal of the display device on the touch-control electrode layer, when the display apparatus shown in FIG. 5 of the embodiment of the present disclosure is formed by forming each film layer on the substrate sequentially, as shown in FIG. 5, the display apparatus may further include a wiring layer between the encapsulation layer 5 and the anti-reflection structure 4. The wiring layer includes wiring 9 electrically connected with the metal layer (the first metal layer 42) on one side close to the substrate 1, and the wiring 9 is coupled with a fixed voltage. In this way, the wiring 9 may be in lap joint with the first metal layer 42 through a via hole penetrating through the first transparent dielectric layer 41, and the wiring 9 is coupled with the fixed voltage, which can shield the interference of the cathode signal of the display device to the touch control.

During specific implementation, the above display apparatus provided by the embodiment of the present disclosure generally has a display region and a peripheral region surrounding the display region, the peripheral region generally has a binding region, the binding region has a binding terminal binding a fixed voltage line, such as a VDD voltage line and a VSS voltage line, and the wiring may be around the peripheral region and be electrically connected with the binding terminal.

During specific implementation, the above display apparatus provided by the embodiment of the present disclosure, as shown in FIG. 5, further includes a protective layer 10 between the anti-reflection layer 8 and the cover plate 6. Since the anti-reflection layer 8 is formed first and then the cover plate 6 is covered, the protective layer 10 is further formed before the cover plate 6 is covered to prevent the anti-reflection layer 8 and the touch-control electrode layer 3 from being scratched.

During specific implementation, in the above display apparatus provided by the embodiment of the present disclosure, as shown in FIG. 4 and FIG. 5, the material of the transparent dielectric layers (the first transparent dielectric layer 41, the second transparent dielectric layer 43 and the third transparent dielectric layer 45) may be the inorganic material or the organic material. The inorganic material may be silicon oxide or silicon nitride, and a thickness of the transparent dielectric layer of the inorganic material is in a range of 50 angstroms to 10000 angstroms; and the organic material may be resin, and a thickness of the transparent dielectric layer of the organic material is in a range of 0.5 μm to 5 μm.

During specific implementation, in the above display apparatus provided by the embodiment of the present disclosure, as shown in FIG. 4 and FIG. 5, the material of the metal layers (the first metal layer 42 and the second metal layer 44) may include one or a combination of Ti, Mo, Cu, Al or Ag, and the thickness of the metal layer may be in a range of 10 angstroms to 1000 angstroms.

The structure shown in FIG. 7 is taken as an example below to test the reflectivity, absorptivity and transmissivity of the anti-reflection structure provided in the embodiment of the present disclosure. It should be noted that the material of the anti-reflection layer 8 in FIG. 7 adopts a black matrix, and the orthographic projection of the anti-reflection layer 8 is greater than the orthographic projection of the touch-control electrode.

Figure 9A:
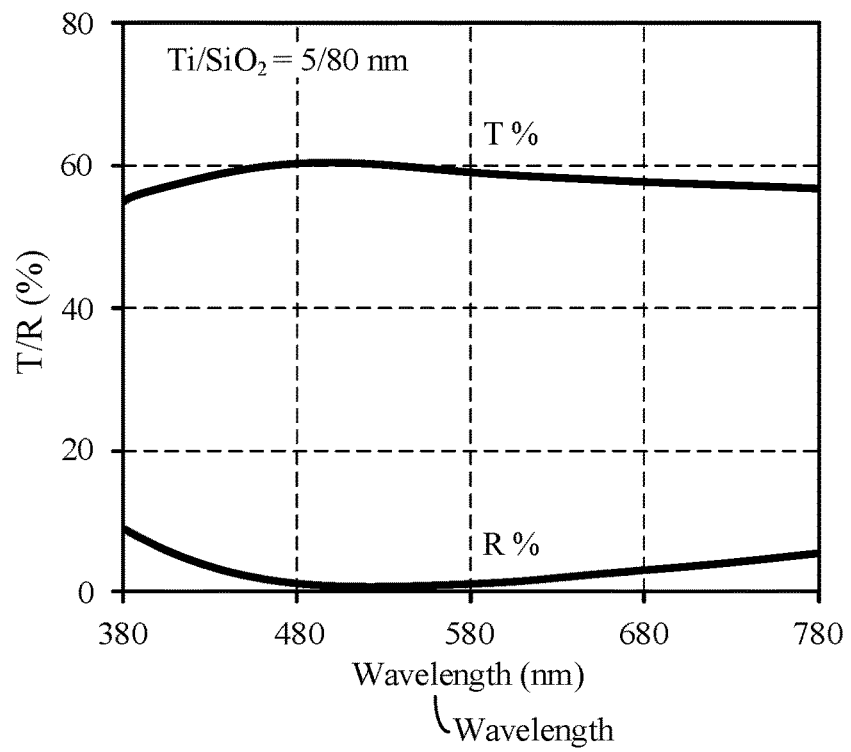
FIG. 9A and FIG. 9B are schematic diagrams of reflection and transmission tests provided by an embodiment of the present disclosure respectively.

Embodiment 1: The anti-reflection structure includes the three layers of structure of the transparent dielectric layer, the metal layer and the transparent dielectric layer. The material of the transparent dielectric layer is silicon oxide, the thickness of the transparent dielectric layer is 80 nm, the material of the metal layer is titanium, and the thickness of the metal layer is 5 nm. As shown in FIG. 9A, the transmissivity of the cover plate is 58%, and the reflectivity of the cover plate is 3%. After matching with the anti-reflection layer in the non-light-emitting region, the reflectivity is reduced from 46% to 9% after being fitted to the surface of the display device.

Figure 9B:
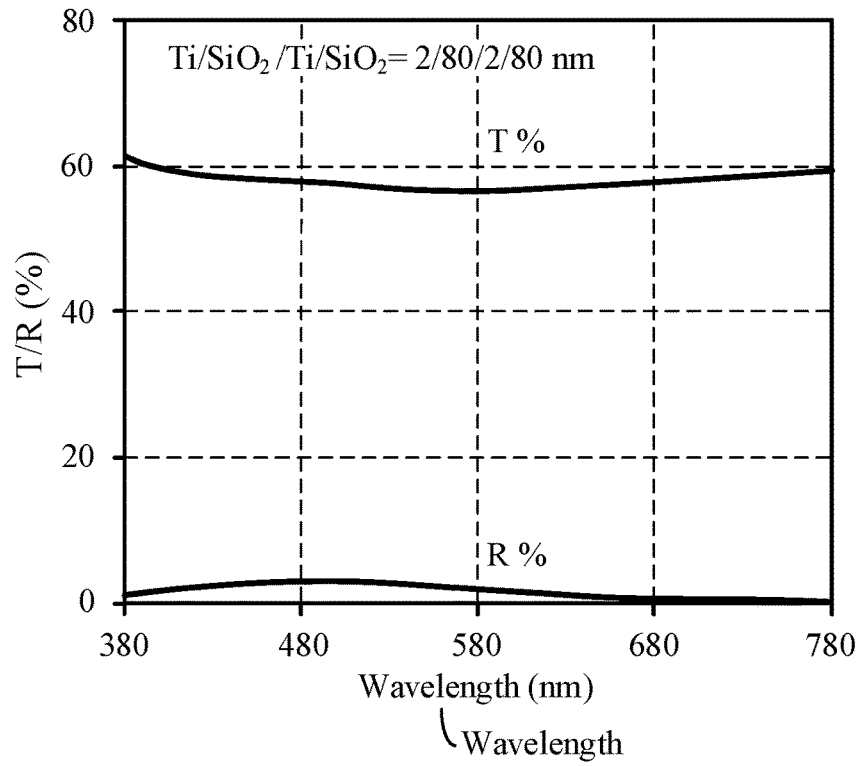

Embodiment 2: The anti-reflection structure includes the five layers of structure of the first transparent dielectric layer, the first metal layer, the second transparent dielectric layer, the second metal layer and the third transparent dielectric layer. The material of the transparent dielectric layers is silicon oxide, the thickness of the transparent dielectric layer is 80 nm, the material of the metal layer is titanium, and the thickness of the metal layer is 2 nm. As shown in FIG. 9B, the transmissivity of the cover plate is 58%, and the reflectivity of the cover plate is 1.7%. After matching with the anti-reflection layer in the non-light-emitting region, the reflectivity is reduced from 46% to 8% after being fitted to the surface of the display device.

Embodiment 3: The anti-reflection structure includes the five layers of structure of the first transparent dielectric layer, the first metal layer, the second transparent dielectric layer, the second metal layer and the third transparent dielectric layer. The material of the transparent dielectric layers is silicon oxide, the thickness of the transparent dielectric layer is 80 nm, the material of the metal layer is titanium, and the thickness of the metal layer is 3.5 nm. It is found through the test that the transmissivity of the cover plate is 40%, and the reflectivity of the cover plate is 1.7%. After matching with the anti-reflection layer in the non-light-emitting region, the reflectivity is reduced from 46% to 5% after being fitted to the surface of the display device.

It can be seen from the above Embodiments 1 to 3 that the conductivity, reflective ability and absorption ability of the metal material are all strongly related to its thickness. The different conductivities, reflective abilities and absorption abilities may be obtained by adjusting the thickness of the metal layer. FIG. 9A and FIG. 9B can both prove that the use of the anti-reflection structure instead of the circular polarizer can reduce reflection so as to reduce the glare generated by reflecting the ambient light. In addition, the use of the anti-reflection structure instead of the circular polarizer in the present disclosure can reduce the thickness of the display apparatus and improve the bending ability of the display apparatus.

Figure 10:
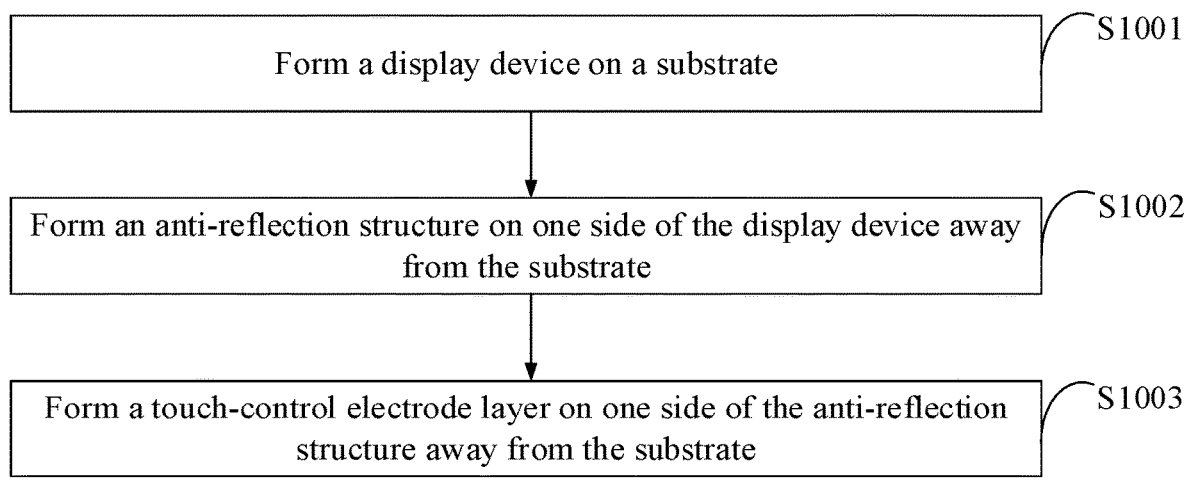
FIG. 10 is a schematic flow diagram of a manufacturing method for a display apparatus provided by an embodiment of the present disclosure.

Based on the same inventive concept, an embodiment of the present disclosure further provides a manufacturing method for a display apparatus, as shown in FIG. 10, including the following.

S1001, a display device is formed on a substrate.

S1002, an anti-reflection structure is formed on one side of the display device away from the substrate, wherein the anti-reflection structure includes transparent dielectric layers and a metal layer which are arranged in an alternating and stacked manner, the metal layer is between the transparent dielectric layers, there are at least two transparent dielectric layers, and there is at least one metal layer.

S1003, a touch-control electrode layer is formed on one side of the anti-reflection structure away from the substrate.

According to the above manufacturing method of the display apparatus provided by the embodiment of the present disclosure, the anti-reflection structure is arranged between the display device and the touch-control electrode layer, thus the anti-reflection structure avoids use of a circular polarizer, reduces a thickness of the display apparatus, and improves bending resistance of the display apparatus. The transparent dielectric layers and the metal layer which are arranged in the alternating and stacked manner can reduce light generated by reflection of the display apparatus and scatter ambient light, thus greatly reducing glare generated by the reflection, reducing an intensity of the external ambient light received by a viewer, enhancing anti-reflection performance of the display apparatus, and thus improving visibility of the display apparatus.

Figure 11:
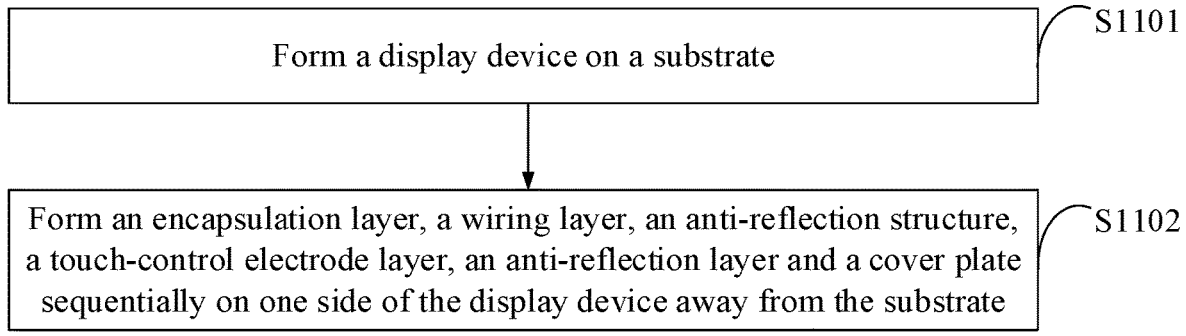
FIG. 11 is a schematic flow diagram of a manufacturing method for another display apparatus provided by an embodiment of the present disclosure.

During specific implementation, in the above manufacturing method provided by the embodiment of the present disclosure, as shown in FIG. 11, forming the display apparatus may specifically include the following.

S1101, a display device is formed on a substrate.

S1102, an encapsulation layer, a wiring layer, an anti-reflection structure, a touch-control electrode layer, an anti-reflection layer and a cover plate are sequentially formed on one side of the display device away from the substrate.

Figure 12:
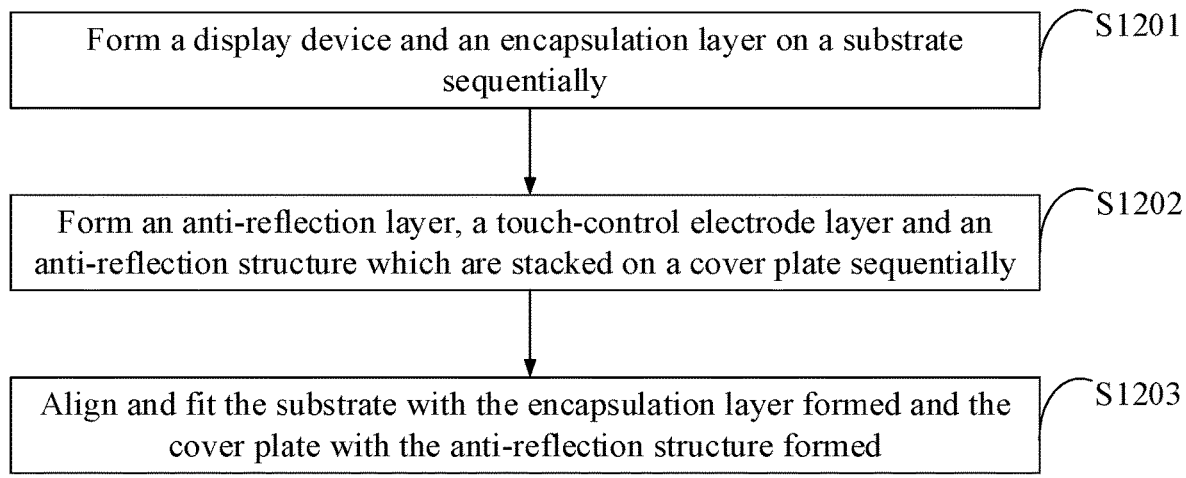
FIG. 12 is a schematic flow diagram of a manufacturing method for another display apparatus provided by an embodiment of the present disclosure.

During specific implementation, in the above manufacturing method provided by the embodiment of the present disclosure, as shown in FIG. 12, forming the display apparatus may specifically include the following.

S1201, a display device and an encapsulation layer are formed on a substrate sequentially.

S1202, an anti-reflection layer, a touch-control electrode layer and an anti-reflection structure which are stacked are formed on a cover plate sequentially.

S1203, the substrate with the encapsulation layer formed and the cover plate with the anti-reflection structure formed are aligned and fitted.

The manufacturing method for the display apparatus shown in FIG. 4 and FIG. 5 provided by the embodiment of the present disclosure is illustrated in detail below.

The step of manufacturing the display apparatus shown in FIG. 4 may include the following.

(1) A film layer of an MoTaOx material is deposited on the cover plate 6.

(2) A film layer of a metal material is deposited on the basis of step (1), and the metal material is preferably Ti or Al or Mo.

(3) The film layer of the MoTaOx material and the film layer of the metal material are etched by exposure on the basis of step (2) to form the anti-reflection layer 8 and a drive electrode 31.

(4) A film layer of an insulating material is deposited on the basis of step (3) to form an insulating layer 7, and the insulating material is preferably silicon oxide or silicon nitride.

(5) The film layer of the metal material is deposited on the basis of step (4), and the metal material is preferably Ti or Al or Mo.

(6) The metal film layer is exposed and etched on the basis of step (5) to form an induction electrode 32.

(7) A transparent insulating material, preferably silicon oxide, is deposited on the basis of step (6) to form a first transparent dielectric layer 41.

(8) The film layer of the metal material is deposited by sputtering deposition or electrochemical deposition on the basis of step (7), and the metal material is preferably Ti, Mo, Cu, Al or Ag, with a thickness in a range of 10 A to 1000 A.

(9) The film layer of the metal material is exposed and etched on the basis of step (8) to form a first metal layer 42.

(10) The transparent insulating material is deposited by chemical vapor deposition on the basis of step (9). The transparent insulating material is preferably a low-refractive-index material, such as silicon oxide (n=1.46), with a thickness in a range of 50 A to 50000 A so as to form a second transparent dielectric layer 43.

(11) The film layer of the metal material is deposited by sputtering deposition or electrochemical deposition on the basis of step (10), and the metal material is preferably Ti, Mo, Cu, Al or Ag, with a thickness in a range of 10 A to 1000 A.

(12) The film layer of the metal material is exposed and etched on the basis of step (11) to form a second metal layer 44.

(13) The transparent insulating material is deposited by chemical vapor deposition on the basis of step (12). The transparent insulating material is preferably a low-refractive-index material, such as silicon oxide (n=1.46), with a thickness in a range of 50 A to 50000 A so as to form a third transparent dielectric layer 45.

(14) The display device 2 and the encapsulation layer 5 are formed on the substrate 1 sequentially.

(15) A cover plate module obtained in step (13) and a display module obtained in step (14) are aligned and fitted to form the display apparatus shown in FIG. 4.

The step of manufacturing the display apparatus shown in FIG. 5 may include the following.

(1) The display device 2 and the encapsulation layer 5 are formed on the substrate 1 sequentially, and a film layer of a metal material is deposited on one side of the encapsulation layer 5 away from the substrate 1.

(2) The wiring layer including wiring 9 is formed on a surface of the encapsulation layer 5 by exposure and etching on the basis of step (1), and the wiring 9 is in a non-light-emitting region.

(3) A transparent insulating material is deposited by chemical vapor deposition on the basis of step (2) to form a first transparent dielectric layer 41. The transparent insulating material is preferably a low-refractive-index material, such as silicon oxide (n=1.46), with a thickness in a range of 50 A to 50000 A.

(4) The first transparent dielectric layer 41 in step (3) is exposed and etched to form a via hole.

(5) The film layer of the metal material is deposited by sputtering deposition or electrochemical deposition on the basis of step (4), and the metal material is preferably Ti, Mo, Cu, Al or Ag, with a thickness in a range of 10 A to 1000 A. The film layer of the metal material is in lap joint with the wiring 9.

(6) The film layer of the metal material is exposed and etched on the basis of step (5) to form a first metal layer 42.

(7) A low transparent insulating material is deposited by chemical vapor deposition on the basis of step (6) to form a second transparent dielectric layer 43. The transparent insulating material is preferably a low-refractive-index material, such as silicon oxide (n=1.46), with a thickness in a range of 50 A to 50000 A.

(8) The film layer of the metal material is deposited by sputtering deposition or electrochemical deposition on the basis of step (7), and the film layer of the metal material is preferably Ti, Mo, Cu, Al or Ag, with a thickness in a range of 10 A to 1000 A.

(9) The film layer of the metal material in step (8) is exposed and etched to form a second metal layer 44.

(10) The low transparent insulating material is deposited by chemical vapor deposition on the basis of step (9) to form a third transparent dielectric layer 45. The transparent insulating material is preferably a low-refractive-index material, such as silicon oxide (n=1.46), with a thickness in a range of 50 A to 50000 A.

(11) The film layer of the metal material, preferably Ti or Al or Mo, is deposited on the basis of step (10).

(12) The film layer of the metal material in step (11) is exposed and etched to form an induction electrode 32.

(13) An insulating layer 7 is deposited on the basis of step (12), and a material of the insulating layer is preferably silicon oxide or silicon nitride.

(14) The film layer of the metal material, preferably Ti or Al or Mo, is deposited on the basis of step (13).

(15) A film layer of an MoTaOx material is deposited on the basis of step (14).

(16) For step (15), a drive electrode 31 and an anti-reflection layer 8 are formed by exposure and etching.

(17) A protective layer 10 is deposited on the basis of step (16). A material of the protective layer 10 may be resin, or a passivation layer of silicon nitride or silicon oxide.

(18) The cover plate 6 is arranged on the basis of step (17) to form the structure shown in FIG. 5.

The above display apparatus provided by the embodiment of the present disclosure may be: any product or component with a display function, such as a mobile phone, a tablet computer, a television, a displayer, a notebook computer, a digital photo frame, and a navigator.

The embodiments of the present disclosure provide the display apparatus and the manufacturing method therefor. The anti-reflection structure is arranged between the display device and the touch-control electrode layer, thus the anti-reflection structure avoids the use of the circular polarizer, reduces the thickness of the display apparatus, and improves the bending resistance of the display apparatus. The transparent dielectric layers and the metal layer which are arranged in the alternating and stacked manner can reduce the light generated by reflection of the display apparatus and scatter the ambient light, thus greatly reducing the glare generated by the reflection, reducing the intensity of the external ambient light received by the viewer, enhancing the anti-reflection performance of the display apparatus, and thus improving the visibility of the display apparatus.

Although the preferred embodiments of the present disclosure have been described, those skilled in the art can make additional modifications and variations on these embodiments once they know the basic creative concept. Therefore, the appended claim intends to be explained as including the preferred embodiments and all modifications and variations falling within the scope of the present disclosure.

Obviously, those skilled in the art can make various modifications and variations to the embodiment of the present disclosure without departing from the spirit and scope of the embodiment of the present disclosure. In this way, if these modifications and variations of the embodiments of the present disclosure fall within the scope of the claims of the present disclosure and their equivalent art, the present disclosure also intends to include these modifications and variations.

What is claimed is:

1. A display apparatus, comprising:
   a substrate;
   a display device on the substrate;
   a touch-control electrode layer on one side of the display device away from the substrate;
   an anti-reflection structure between the display device and the touch-control electrode layer, wherein the anti-reflection structure comprises at least two transparent dielectric layers and at least one metal layer which are arranged in an alternating and stacked manner, and the metal layer is between the transparent dielectric layers;
   an encapsulation layer between the display device and the touch-control electrode layer, wherein the anti-reflection structure is between the encapsulation layer and the touch-control electrode layer; and
   an anti-reflection layer on one side of the touch-control electrode layer away from the substrate, wherein an orthographic projection of the anti-reflection layer on the substrate at least covers an orthographic projection of a touch-control electrode of the touch-control electrode layer on the substrate.

2. The display apparatus according to claim 1, wherein the anti-reflection structure comprises a first transparent dielectric layer, a first metal layer, a second transparent dielectric layer, a second metal layer, and a third transparent dielectric layer which are arranged in the alternating and stacked manner.

3. The display apparatus according to claim 1, wherein an orthographic projection of the metal layer on the substrate does not overlap an orthographic projection of a touch-control electrode of the touch-control electrode layer on the substrate.

4. The display apparatus according to claim 1, wherein the anti-reflection structure is on a surface of the touch-control electrode layer facing the display device.

5. The display apparatus according to claim 1, wherein the anti-reflection structure is on a surface of the encapsulation layer facing the touch-control electrode layer.

6. The display apparatus according to claim 5, further comprising a wiring layer between the encapsulation layer and the anti-reflection structure, wherein the wiring layer comprises wiring electrically connected with the metal layer on one side close to the substrate, and the wiring is coupled with a fixed voltage.

7. The display apparatus according to claim 6, comprising a display region and a peripheral region surrounding the display region, wherein the peripheral region has a binding region, the binding region has a binding terminal binding a fixed voltage line, and the wiring is around the peripheral region and is electrically connected with the binding terminal.

8. The display apparatus according to claim 1, wherein a material of the anti-reflection layer is MoTaOx or a black matrix material.

9. The display apparatus according to claim 1, wherein the touch-control electrode comprises a drive electrode and an induction electrode which are arranged in an insulating cross manner, the display device comprises a plurality of sub-pixels with different light-emitting colors, and orthographic projections of the drive electrode and the induction electrode on the substrate have overlapping regions with each of the sub-pixels.

10. The display apparatus according to claim 1, further comprising a cover plate on one side of the anti-reflection layer away from the substrate.

11. The display apparatus according to claim 1, wherein a material of the transparent dielectric layers is an inorganic material or an organic material, a thickness of the transparent dielectric layer of the inorganic material is in a range of 50 angstroms to 10000 angstroms, and a thickness of the transparent dielectric layer of the organic material is in a range of 50 angstroms to 50000 angstroms.

12. The display apparatus according to claim 1, wherein a material of the metal layer comprises one or a combination of Ti, Mo, Cu, Al or Ag, and a thickness of the metal layer is in a range of 10 angstroms to 1000 angstroms.

13. The display apparatus according to claim 10, further comprising a protective layer between the anti-reflection layer and the cover plate.

* * * * *